United States Patent
Shionoya

(10) Patent No.: US 10,950,471 B2
(45) Date of Patent: Mar. 16, 2021

(54) LASER MACHINING DEVICE AND LASER MACHINING METHOD

(71) Applicant: Tokyo Seimitsu Co., Ltd., Hachioji (JP)

(72) Inventor: Takao Shionoya, Hachioji (JP)

(73) Assignee: TOKYO SEIMITSU CO., LTD., Tokyo (JP)

( * ) Notice: Subject to any disclaimer, the term of this patent is extended or adjusted under 35 U.S.C. 154(b) by 0 days.

(21) Appl. No.: 17/024,329

(22) Filed: Sep. 17, 2020

(65) Prior Publication Data

US 2021/0005476 A1 Jan. 7, 2021

Related U.S. Application Data

(63) Continuation of application No. PCT/JP2019/009947, filed on Mar. 12, 2019.

(30) Foreign Application Priority Data

Mar. 20, 2018 (JP) .............................. JP2018-052870
Mar. 7, 2019 (JP) .............................. JP2019-041148

(51) Int. Cl.
*H01L 21/67* (2006.01)
*B23K 26/046* (2014.01)
(Continued)

(52) U.S. Cl.
CPC ...... *H01L 21/67092* (2013.01); *B23K 26/032* (2013.01); *B23K 26/046* (2013.01);
(Continued)

(58) Field of Classification Search
CPC ............... H01L 21/67115; H01L 21/78; H01L 21/67092; H01L 23/544; B23K 26/082; B23K 23/032; B23K 2103/56
See application file for complete search history.

(56) References Cited

U.S. PATENT DOCUMENTS

2008/0218735 A1 9/2008 Atsumi et al.
2016/0372349 A1* 12/2016 Hyakumura ....... B23K 26/0622

FOREIGN PATENT DOCUMENTS

JP    2005-193284 A    7/2005
JP    2008-93724 A     4/2008
(Continued)

OTHER PUBLICATIONS

International Preliminary Report on Patentability and Written Opinion of the International Searching Authority (Forms PCT/IB/373, PCT/IB/338, PCT/ISA/237) for International Application No. PCT/JP2018/042540, dated Sep. 22, 2020, with English translation.
(Continued)

*Primary Examiner* — Seahvosh Nikmanesh
(74) *Attorney, Agent, or Firm* — Birch. Stewart. Kolasch & Birch, LLP

(57) ABSTRACT

Provided are a laser machining device and a laser machining method capable of stably operating an autofocus function without causing an unfavorable state such as an overshoot etc. A laser machining device and a laser machining method of the present invention performs a normal AF (autofocus) control when a scan position of the machining laser light and the detecting laser light is located in a work central portion, and performs a slow-tracking AF (autofocus) control with a trackability to a displacement of a main surface of a work reduced to be lower than a trackability of the normal AF control when the scan position of the machining laser light and the detecting laser light is located in a work end portion.

20 Claims, 8 Drawing Sheets

(51) Int. Cl.

| | |
|---|---|
| *B23K 26/53* | (2014.01) |
| *B23K 26/03* | (2006.01) |
| *B23K 26/082* | (2014.01) |
| *H01L 21/268* | (2006.01) |
| *H01L 21/78* | (2006.01) |
| *H01L 23/544* | (2006.01) |
| *B23K 26/06* | (2014.01) |
| *B23K 26/08* | (2014.01) |
| *B23K 103/00* | (2006.01) |

(52) U.S. Cl.
CPC ........ *B23K 26/0648* (2013.01); *B23K 26/082* (2015.10); *B23K 26/083* (2013.01); *B23K 26/53* (2015.10); *H01L 21/268* (2013.01); *H01L 21/67115* (2013.01); *H01L 21/78* (2013.01); *H01L 23/544* (2013.01); *B23K 2103/56* (2018.08); *H01L 2223/5446* (2013.01)

(56) References Cited

FOREIGN PATENT DOCUMENTS

| | | |
|---|---|---|
| JP | 2008-200745 A | 9/2008 |
| JP | 2009-297773 A | 12/2009 |
| JP | 2015-198182 A | 11/2015 |
| JP | 2016-139727 A | 8/2016 |
| WO | WO 2019/181063 A1 | 9/2019 |
| WO | WO 2019/181637 A1 | 9/2019 |

OTHER PUBLICATIONS

Appeal Decision for Japanese Patent Application No. 2018-246898, dated Oct. 23, 2019.
Decision of Refusal for Japanese Patent Application No. 2018-246898, dated May 21, 2019.
International Preliminary Report on Patentability (PCT/IPEA/409 and PCT/IPEA/416) issued PCT/JP2019/009947, dated Mar. 31, 2020.
International Search Report (PCT/ISA/210) issued in PCT/JP2018/042540, dated Feb. 12, 2019.
International Search Report (PCT/ISA/210) issued in PCT/JP2019/009947, dated May 14, 2019.
Notice of Reasons for Refusal for Japanese Patent Application No. 2018-246898, dated Apr. 10, 2019.
Written Opinion (PCT/ISA/237) issued in PCT/JP2018/042540, dated Feb. 12, 2019.
Written Opinion (PCT/ISA/237) issued in PCT/JP2019/009947, dated May 14, 2019.

\* cited by examiner

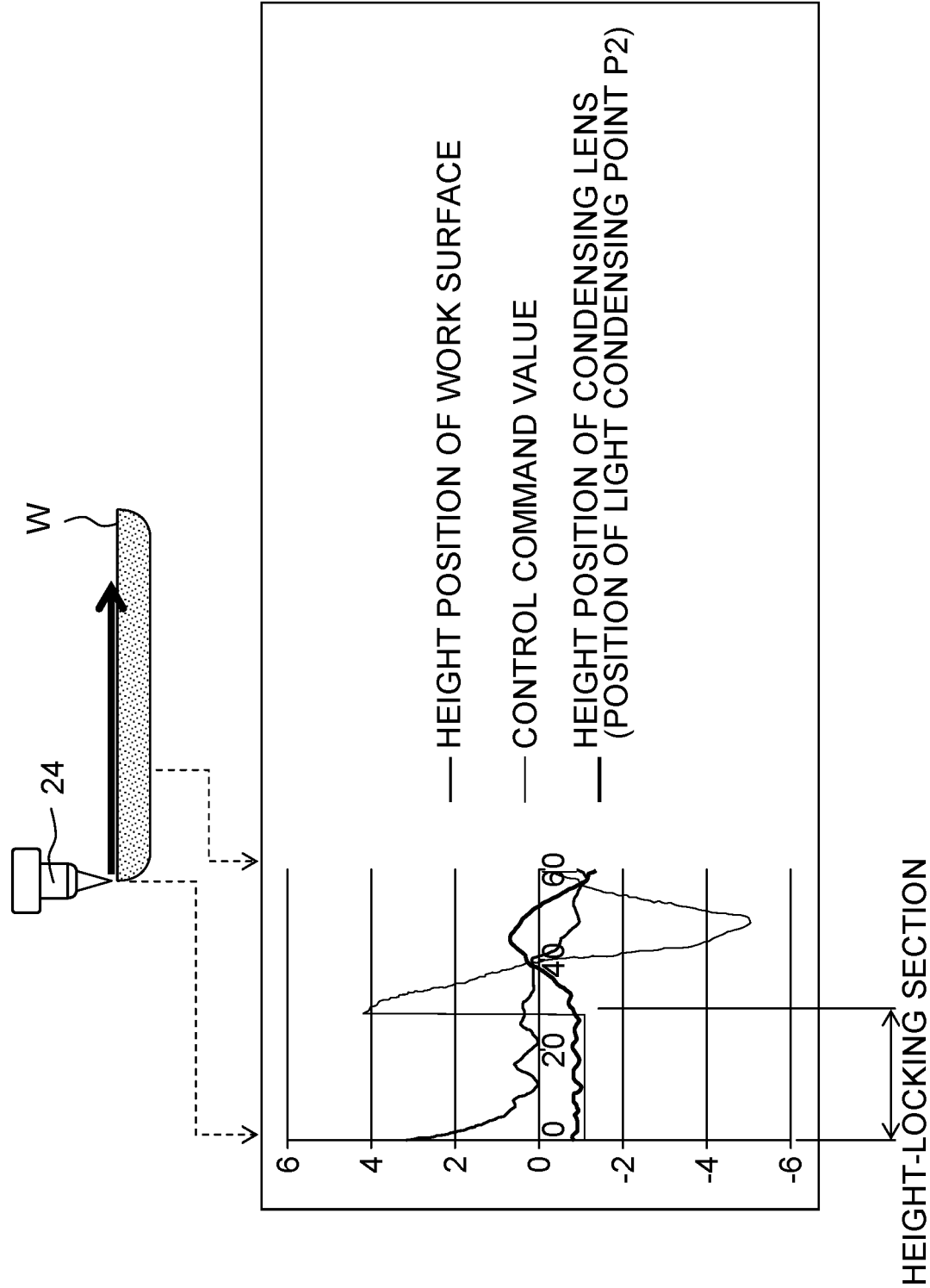

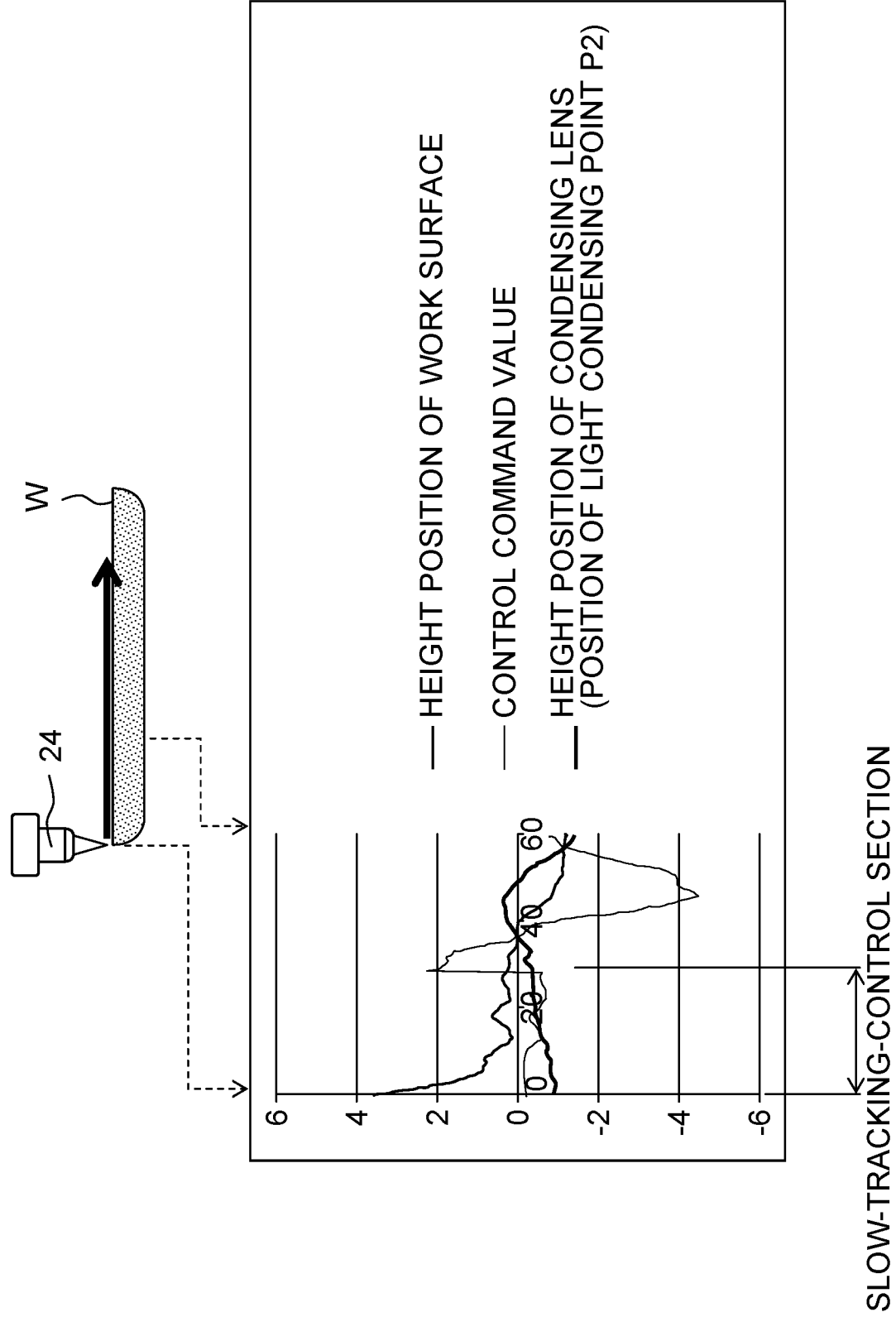

LASER MACHINING DEVICE AND LASER MACHINING METHOD

CROSS-REFERENCE TO RELATED APPLICATIONS

The present application is a Continuation of PCT International Application No. PCT/JP2019/009947 filed on Mar. 12, 2019 claiming priorities under 35 U.S.C. § 119(a) to Japanese Patent Application No. 2018-052870 filed on Mar. 20, 2018 and Japanese Patent Application No. 2019-041148 filed on Mar. 7, 2019. Each of the above applications is hereby expressly incorporated by reference, in their entirety, into the present application.

BACKGROUND OF THE INVENTION

1. Field of the Invention

The present invention relates to a laser machining technology for machining a work with a laser light.

2. Description of the Related Art

As a conventional laser machining technology, there is known a technology which condenses a machining laser light on a front surface of a work or inside the work via a condensing lens while scanning the work and performs machining.

In such a laser machining technology, in order to keep a constant height (or a machining depth) of a light condensing point of the machining laser light, an autofocus function is used for a feedback control in which a position of the condensing lens is adjusted such that the condensing lens tracks the displacement of the surface (laser light irradiation surface) of the work (for example, see Japanese Patent Application Laid-Open No. 2005-193284, hereinafter referred to as "PTL 1").

However, in the control for maintaining a desired distance between the light condensing point of the machining laser light and the front surface of the work by the autofocus function, an unfavorable state such as an overshoot, a hunting, or an oscillation (hereinafter referred to as "an overshoot etc.") may occur when a deviation amount to be eliminated by the control is large.

In particular, in a machining start portion at an end (outer edge) of the work, the phenomenon as described above is likely to occur because of the deviation amount (an initial error in a distance between the light condensing point of the machining laser light and the front surface of the work) which exists before the control by the autofocus function is started.

As a method for reducing such an unfavorable phenomenon, techniques have been proposed such as a technique which does not perform autofocus control in a machining start portion at an end of the work (for example, see PTL 1), and a technique which estimates a height of a machining start point from a height of a neighboring surface in the work (for example, see Japanese Patent Application Laid-Open No. 2009-297773, hereinafter referred as "PTL 2").

CITATION LIST

PTL 1: Japanese Patent Application Laid-Open No. 2005-193284

PTL 2: Japanese Patent Application Laid-Open No. 2009-297773

SUMMARY OF THE INVENTION

However, in the technique disclosed in PTL 1, the deviation amount may increase in a region where the autofocus control is not performed, and in such a case, an unfavorable state such as an overshoot etc. tends to occur after the autofocus control is started.

Further, in the technique disclosed in PTL 2, an unfavorable state such as an overshoot etc. tends to occur when the deviation amount between the estimated height and the actual height is large.

The present invention has been made under the above circumstances, and aims to provide a laser machining device and a laser machining method capable of stably operating an autofocus function without causing an unfavorable state such as an overshoot etc.

In order to achieve the above object, the invention is provided as follows.

A laser machining device according to a first aspect of the present invention includes: a condensing lens configured to condense a machining laser light and a detecting laser light toward a work; a scanner configured to relatively move the condensing lens and the work in a direction orthogonal to an optical axis direction of the condensing lens, to scan the machining laser light and the detecting laser light over the work; an adjuster configured to adjust a distance between the condensing lens and the work; a detector configured to detect a reflected light to output a detection signal according to a height of a main surface of the work, the reflected light being the detecting laser light reflected on the main surface of the work; a first controller configured to control, based on the detection signal output by the detector, the adjuster so as to cause a light condensing point of the detecting laser light to track a displacement of the main surface of the work, in case where a scan position of the machining laser light and the detecting laser light is in a central portion of the work; and a second controller configured to control, based on the detection signal output by the detector, the adjuster so as to cause the light condensing point of the detecting laser light to track the displacement of the main surface of the work with a trackability to the displacement of the main surface of the work reduced to be lower than a trackability of the first controller, in a case where the scan position of the machining laser light and the detecting laser light is in an end portion of the work.

In a laser machining device according to a second aspect of the present invention, the second controller in the first aspect includes: a target control amount calculator configured to calculate a target control amount of the condensing lens based on the detection signal output from the detector; and a tracking controller configured to control the adjuster so as to cause the light condensing point of the detecting laser light to track the displacement of the main surface of the work based on the target control amount calculated by the target control amount calculator.

In a laser machining device according to a third aspect of the present invention, when a position of the light condensing point of the detecting laser light is defined as a first position and a position on the main surface of the work is defined as a second position at a time that the second controller starts tracking, the target control amount calculator in the second aspect sets a position between the first position and the second position as a target position, and calculates the target control amount based on a current position of the light condensing point of the detecting laser light and the target position.

In a laser machining device according to a fourth aspect of the present invention, the second controller in the third aspect calculates, as the target control amount, a value obtained by multiplying a difference between the current position of the light condensing point of the detecting laser light and the target position, by a control gain.

A laser machining device according to a fifth aspect of the present invention, in the fourth aspect, includes a control gain adjuster configured to adjust the control gain according to a user's instruction.

A laser machining device according to a sixth aspect of the present invention, in any one of the first to fifth aspects, includes a determiner configured to determine whether the scan position of the machining laser light and the detecting laser light is in the end portion of the work or in the central portion of the work.

A laser machining method according to a seventh aspect of the present invention is a laser machining method using a laser machining device including a condensing lens configured to condense a machining laser light and a detecting laser light toward a work, a scanner configured to relatively move the condensing lens and the work in a direction orthogonal to an optical axis direction of the condensing lens to scan the machining laser light and the detecting laser light over the work, an adjuster configured to adjust a distance between the condensing lens and the work, and a detector configured to detect a reflected light to output a detection signal according to a height of a main surface of the work, the reflected light being the detecting laser light reflected on the main surface of the work. The laser machining method includes: a first control step of controlling, based on the detection signal output from the detector, the adjuster so as to cause a light condensing point of the detecting laser light to track a displacement of the main surface of the work, in a case where a scan position of the machining laser light and the detecting laser light is in a central portion of the work; and a second control step of controlling, based on the detection signal output from the detector, the adjuster so as to cause the light condensing point of the detecting laser light to track the displacement of the main surface of the work, with a trackability to the displacement of the main surface of the work reduced to be lower than a trackability in the first control step, in a case where the scan position of the machining laser light and the detecting laser light is in an end portion of the work.

According to the present invention, an autofocus function can be stably operated without causing an undesirable state such as an overshoot etc.

BRIEF DESCRIPTION OF THE DRAWINGS

FIG. 7 is a diagram for illustrating a case where another example of slow-tracking AF control is not performed.

FIG. 8 is a diagram for illustrating a case where the other example of slow-tracking AF control is performed.

DESCRIPTION OF EMBODIMENTS

Embodiments of the present invention are described below with reference the accompanying drawings.

[Laser Machining Device]

Figure 1:
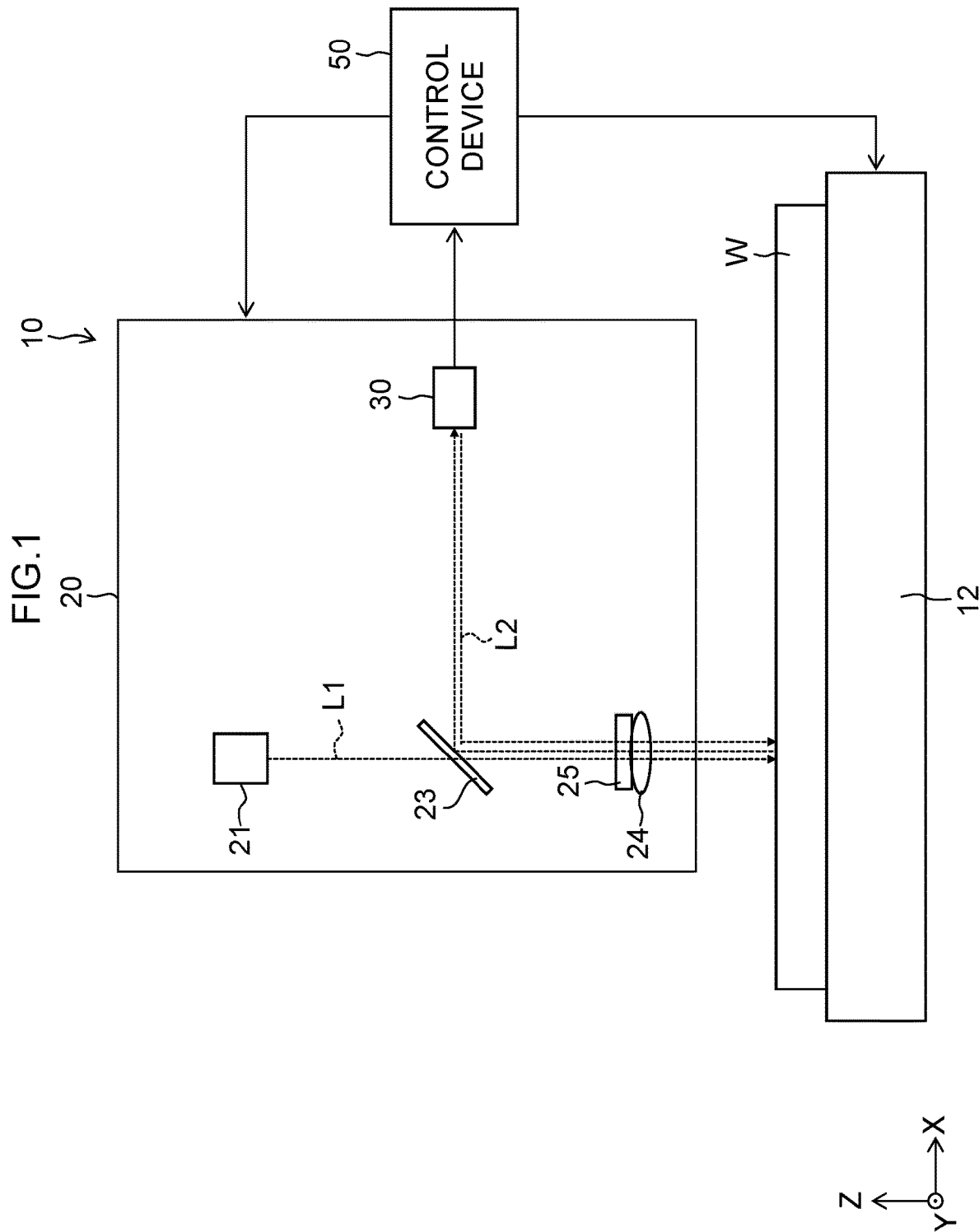
FIG. 1 is a configuration diagram showing an outline of a laser machining device according to the present embodiment.

FIG. 1 is a configuration diagram showing an outline of a laser machining device 10 according to the present embodiment. As shown in FIG. 1, the laser machining device 10 includes a stage 12, an optical system device 20, and a control device 50.

The stage 12 holds a work W by suction. The work W is not particularly limited. For example, the work W may be a semiconductor substrate such as a silicon wafer, a glass substrate, a piezoelectric ceramic substrate, or the like. The work W may be placed on the stage 12 such that a surface opposite to a device surface faces upward, or may be placed on the stage 12 such that the device surface of the work W faces upward. Hereinafter, an upper surface of the work W is referred to as a front surface (laser light irradiation surface) of the work W, and a surface opposite to the front surface is referred to as a back surface of the work W. Here, the front surface of the work W corresponds to "a main surface of the work" of the present invention in the present embodiment.

The stage 12 is configured to be movable in XYZθ directions by a stage moving mechanism (not shown). The stage moving mechanism can be configured with various mechanisms such as a ball screw drive, a linear motor mechanism and the like. The stage 12 is an example of "scanner" of the present invention.

In the example shown in FIG. 1, the three directions of XYZ directions are orthogonal to each other, of which the X and Y directions are the horizontal directions and the Z direction is the vertical direction. Further, the θ direction is a rotation direction around the vertical axis (Z axis) as a rotation axis.

The optical system device 20 is disposed at a position facing the stage 12. The optical system device 20 irradiates the work W with a machining laser light L1 for forming a modified region inside the work W while moving relatively to the stage 12 which holds the work W by suction.

The optical system device 20 includes a laser light source 21, a dichroic mirror 23, a condensing lens 24, an actuator 25, and an autofocus detecting device 30 (hereinafter referred to as "AF detecting device").

The laser light source 21 emits the machining laser light L1 for forming the modified region inside the work W.

The dichroic mirror 23 transmits the machining laser light L1 and reflects a detecting laser light L2 emitted from the AF detecting device 30 to be described below. Here, in the configuration of the present embodiment, the optical axis of the detecting laser light L2 and the optical axis of the machining laser light L1 are emitted so as to be coaxial with each other using the dichroic mirror 23.

The machining laser light L1 emitted from the laser light source 21 passes through the dichroic mirror 23, and then is condensed inside the work W by the condensing lens 24. The position of a light condensing point (focus position) of the machining laser light L1 is adjusted by finely moving the condensing lens 24 in the Z direction by the actuator 25. Note that the actuator 25 adjusts the distance between the condensing lens 24 and the work W, and is an example of "adjuster" of the present invention.

Figure 2:
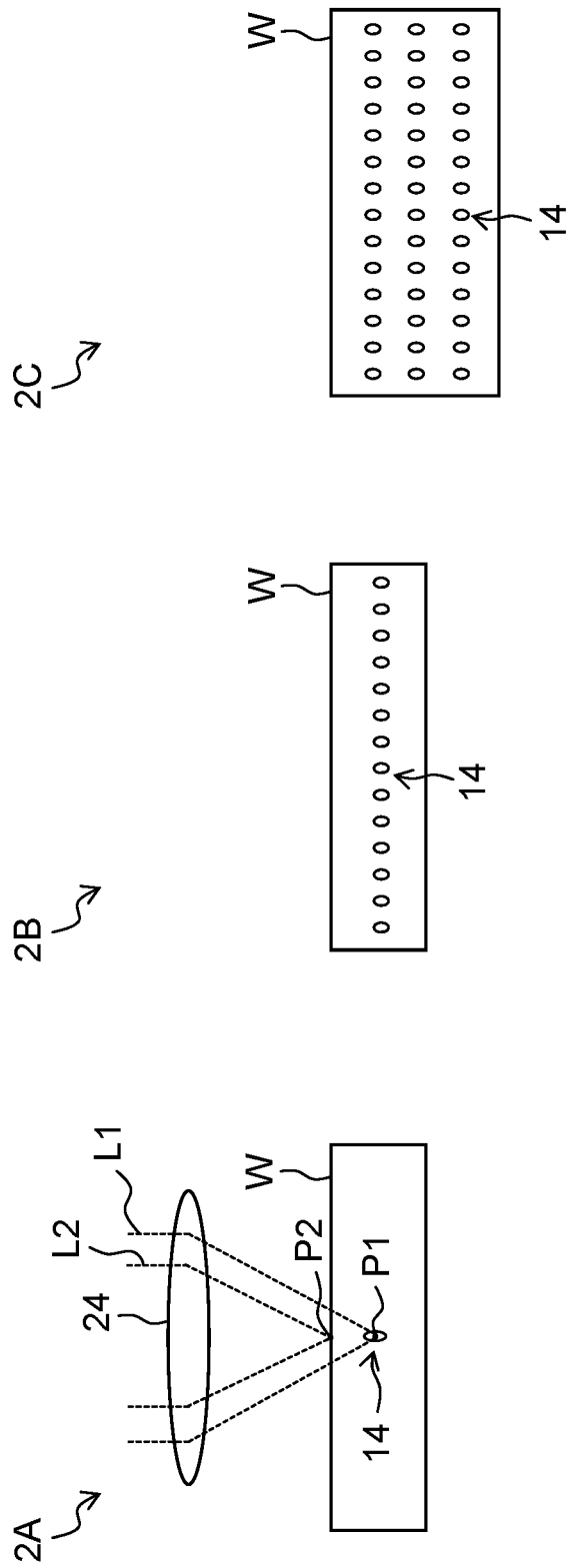
FIG. 2 is a conceptual diagram illustrating a modified region formed in a vicinity of a light condensing point inside a work.

FIG. 2 is a conceptual diagram for illustrating the modified region formed in a vicinity of the light condensing point inside the work W. Reference sign 2A of FIG. 2 shows a state in which the machining laser light L1 incident inside of the work W forms a modified region 14 at the light condensing point. Reference sign 2B of FIG. 2 shows a state in which the work W is moved in the horizontal direction under the intermittent pulsed machining laser light L1, so that discontinuous modified regions 14, 14, are formed in line. Reference sign 2C of FIG. 2 shows a state in which the modified regions 14 are formed in multiple layers inside the work W.

As shown in reference sign 2A of FIG. 2, when the light condensing point P1 of the machining laser light L1 incident from the front surface of the work W is set inside the work W in the thickness direction of the work W, the energy of the machining laser light L1 which has passed through the front surface of the work W is concentrated at the light condensing point P1 inside the work W to form the modified region 14 in the vicinity of the light condensing point P1 inside the work W. As shown in reference sign 2B of FIG. 2, irradiating the work W with intermittent pulsed machining laser light L1 to form a plurality of the modified regions 14, 14, along a planned dividing line breaks the balance of intermolecular forces of the work W. As a result, the work W is spontaneously cut, or is cut by applying a slight external force, with the modified regions 14, 14, . . . as a starting point.

In addition, the work W having a large thickness cannot be cut with a single layer of the modified region 14. Therefore, as shown in reference sign 2C of FIG. 2, the light condensing point of the machining laser light L1 is moved in the thickness direction of the work W to form the modified regions 14 in multiple layers in order to cut the work W.

Furthermore, although the examples shown in reference signs 2B and 2C of FIG. 2 show the states in which the discontinuous modified regions 14, 14, . . . are formed by the intermittent pulsed machining laser light L1, the modified regions 14 may be formed continuously under a continuous wave of the machining laser light L1. The work W having the discontinuous modified regions 14 formed therein is less likely to be cut than the work W having the continuous modified regions 14 formed therein, so that it is appropriately selected whether to use the continuous wave or the intermittent wave of the machining laser light L1 depending on the thickness of the work W, circumstances such as safety during transportation, and so on.

Returning to FIG. 1, the AF detecting device 30 emits the detecting laser light L2 for detecting position information regarding the height position (Z direction position) of the front surface of the work W (laser light irradiation surface) and receives a reflected light of the detecting laser light L2 reflected on the front surface of the work W, and then, detects and outputs a detection signal according to the height of the front surface of the work W based on the received reflected light. Note that the AF detecting device 30 is an example of "detector" of the present invention.

The AF detecting device 30 includes a detecting laser light source (not shown) which emits the detecting laser light L2. The detecting laser light L2 has a wavelength that is different from that of the machining laser light L1 and that can be reflected on the front surface of the work W.

The detecting laser light L2 emitted from the detecting laser light source of the AF detecting device 30 is reflected by the dichroic mirror 23, condensed by the condensing lens 24, and incident on the front surface of the work W. The reflected light of the detecting laser light L2 reflected on the work W is further reflected by the dichroic mirror 23 via the condensing lens 24 and is received by a light receiving surface of a photodetector (not shown) provided in the AF detecting device 30. Then, the distribution and quantity of the reflected light received by the photodetector are detected.

Here, the distribution and quantity of the reflected light of the detecting laser light L2 reflected on the front surface of the work W changes depending on the distance (hereinafter referred to as "defocus distance") between the light condensing point P2 of the detection laser light L2 and the front surface of the work W, that is, the displacement of the front surface of the work W (irregular shape or convexoconcave). The AF detecting device 30 utilizes this property to detect and output a detection signal corresponding to the height position of the front surface of the work W, based on the change in distribution and quantity of the reflected light of the detecting laser light L2 reflected on the front surface of the work W. Note that as a detection method in the AF detecting device 30, for example, an astigmatism method, a knife edge method or the like can be preferably used. Since these methods are known, detailed description is omitted here.

The detecting operation by the AF detecting device 30 as described above is continuously performed on the planned dividing line determined in advance. This enables a real time feedback control of the light condensing point P1 of the machining laser light L1 based on the detection result of the AF detecting device 30 during formation of the modified region 14 inside the work W along the planned dividing line.

The control device 50 shown in FIG. 1 stores data and the like necessary for operation and machining by each unit of the laser machining device 10.

The control device 50 is embodied by a general-purpose computer such as a personal computer or a microcomputer. The control device 50 is configured with devices including a processor such as CPU (Central Processing Unit) or FPGA (Field Programmable Gate Array), a memory such as ROM (Read Only Memory) or RAM (Random Access Memory), an input device such as keyboard and mouse, an output device such as monitor, and/or other peripheral circuits. The control device 50 executes a predetermined operation program using these devices to perform processes for achieving the function of each unit of the control device 50 shown in FIG. 3.

Figure 3:
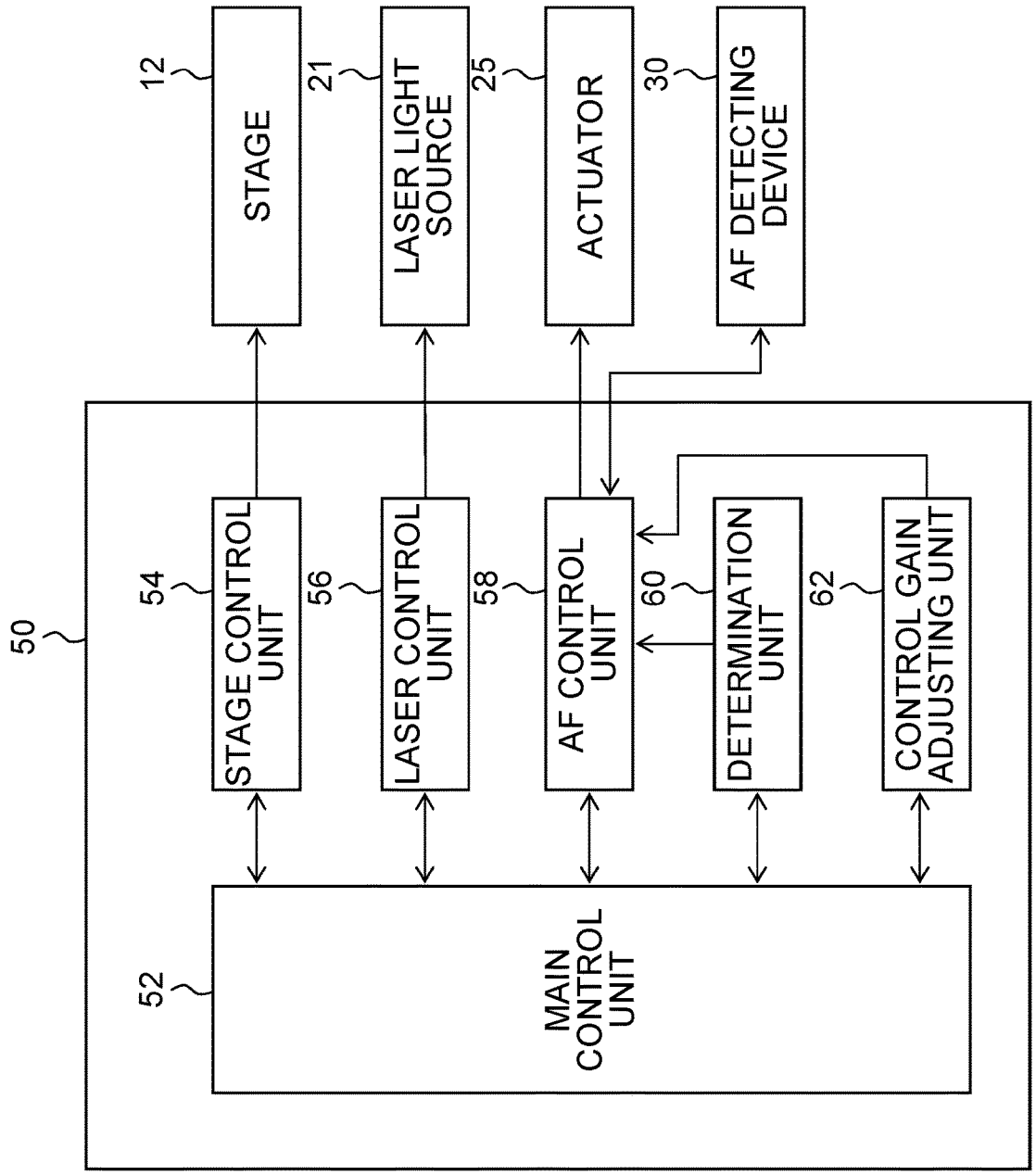
FIG. 3 is a block diagram showing a configuration of a control device.

FIG. 3 is a block diagram showing a configuration of the control device 50. As shown in FIG. 3, the control device 50 functions as a main control unit 52, a stage control unit 54, a laser control unit 56, an AF (autofocus) control unit 58, a determination unit 60, and a control gain adjusting unit 62.

The main control unit 52 is a functional unit that integrally controls each unit of the laser machining device 10. Specifically, the main control unit 52 integrally controls the stage control unit 54, the laser control unit 56, the AF control unit 58, the determination unit 60, and the control gain adjusting unit 62.

The stage control unit 54 outputs a control signal for controlling the movement (including rotation) of the stage 12, to the stage 12.

The laser control unit 56 is a unit for controlling the emission of the machining laser light L1, and outputs a control signal for controlling the wavelength, pulse width, intensity, emission timing, repetition frequency, etc. of the machining laser light L1 to the laser light source 21.

The AF control unit 58 outputs, to the actuator 25, a control signal for controlling the drive of the actuator 25 based on the detection signal output from the AF detecting device 30. The AF control unit 58 also outputs a control signal for controlling the emission of the detecting laser light L2 to the detecting laser light source of the AF detecting device 30.

The determination unit 60 is a functional unit that performs determination process that determines whether a scan position of the laser lights (the machining laser light L1 and the detecting laser light L2) which scan the planned dividing line of work W, is located in a work end portion R1 or in a work central portion R2, among work regions. The determination unit 60 is an example of "determiner" in the present invention.

A method that can be adopted as an example of a determination processing method in the determination unit 60 is, for example, a method of performing a determination process based on information about the work W (including a size of the work W), the moving speed of the stage 12, or the like, which is set in a memory unit (not shown) of the control device 50. Note that as the determination processing method in the determination unit 60, any other determination processing method may be adopted so long as the method can determine whether the scan position of the laser lights which scan the planned dividing line of the work W, is located in the work end portion R1 or in the work central portion R2, among the work regions. For example, a measurement result of the AF detecting device 30 may be used for a work region determination process.

The control gain adjusting unit 62 is a functional unit that adjusts a control gain to be described below according to what a user instructs via the input device.

[AF Controls]

Next, AF controls performed by the AF control unit 58 are described below in detail.

Figure 4:
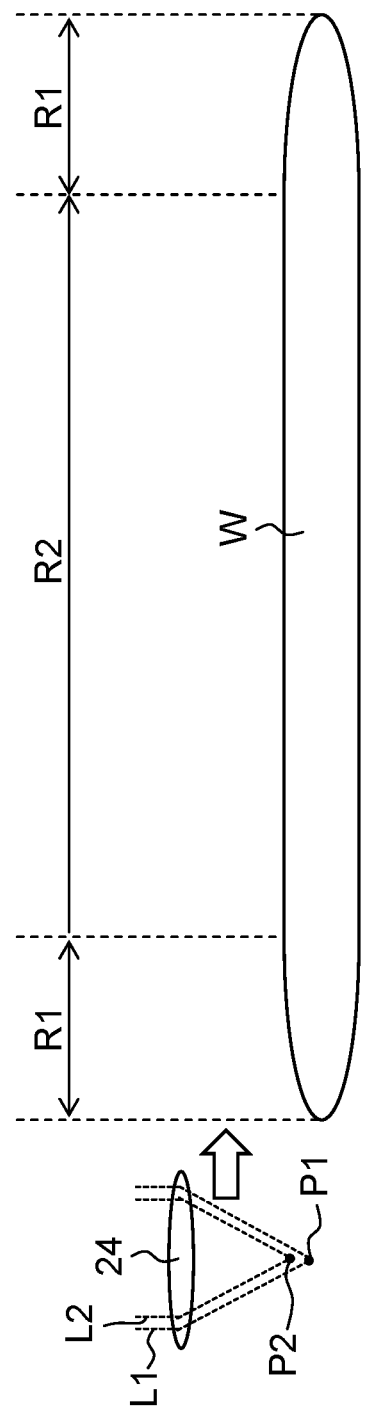
FIG. 4 is a diagram showing how a condensing lens and the work are relatively moved along a planned dividing line of the work.

FIG. 4 is a diagram showing a how the condensing lens 24 and the work W are relatively moved along the planned dividing line of the work W.

As shown in FIG. 4, the condensing lens 24 is relatively moved from a position outside the work W toward the inside of the work W along the planned dividing line of the work W, so that the work W is scanned with the machining laser light L1 and the detecting laser light L2. During this scanning, the AF detecting device 30 detects the detection signal indicating the height position of the front surface of the work W (hereinafter referred to as "work surface") and outputs the detection signal to the AF control unit 58 in each control cycle.

The AF control unit 58 drives the actuator 25 to move the condensing lens 24 in the optical axis direction based on the detection signal detected by the AF detecting device 30 so that the distance between the condensing lens 24 and the work surface is constant. That is, the AF control unit 58 performs a feedback control of the height position of the condensing lens 24 so as to track (follow) the displacement of the work surface. As a result, when the work W is irradiated with the machining laser light L1 via the condensing lens 24, the modified region 14 can be formed at a position with a constant depth from the work surface. Note that the light condensing point P2 of the detecting laser light L2 is set at a position higher than the light condensing point P1 of the machining laser light L1, by a certain distance. Hereinafter, this control is referred to as "normal AF control", Note that the normal AF control is a known method, and detailed description of the normal AF control is omitted.

Here, in the work end portion R1, the displacement of the work surface is larger than that in the work central portion R2 (the portion excluding the work end portion R1). Therefore, in a case where the AF control unit 58 attempts to perform control for maintaining a desired distance between the light condensing point P1 of the machining laser light L1 and the work surface by the normal AF control, the deviation amount to be eliminated by the control increases, which tends to cause an undesirable state such as an overshoot etc.

Further, when an autofocus function is disabled in the work end portion R1, the deviation amount may increase in a region where the autofocus function is not performed. In such a case, an undesired state such as an overshoot etc. is likely to occur after the AF control is started.

Therefore, in the present embodiment, in order to prevent such a problem, the AF control unit 58 performs the normal AF control in the work central portion R2, and performs an AF control different from the normal AF control (a slow-tracking AF control) in the work end portion R1. Note that the AF control unit 58 functions as "first controller" of the present invention when executing the normal AF control, and functions as "second controller" of the present invention when executing the slow-tracking AF control.

Hereinafter, the slow-tracking AF control which is performed by the AF control unit 58 in the work end portion R1 is described.

In the slow-tracking AF control, the AF control is performed with the controllability (adjustability) of the autofocus function which is lower than the controllability in the normal AF control. That is, in the work end portion R1, the AF control is performed in a state where the autofocus function is performed with reduced (lower) trackability to the displacement of the work surface, instead of disabling the autofocus function.

Figure 5:
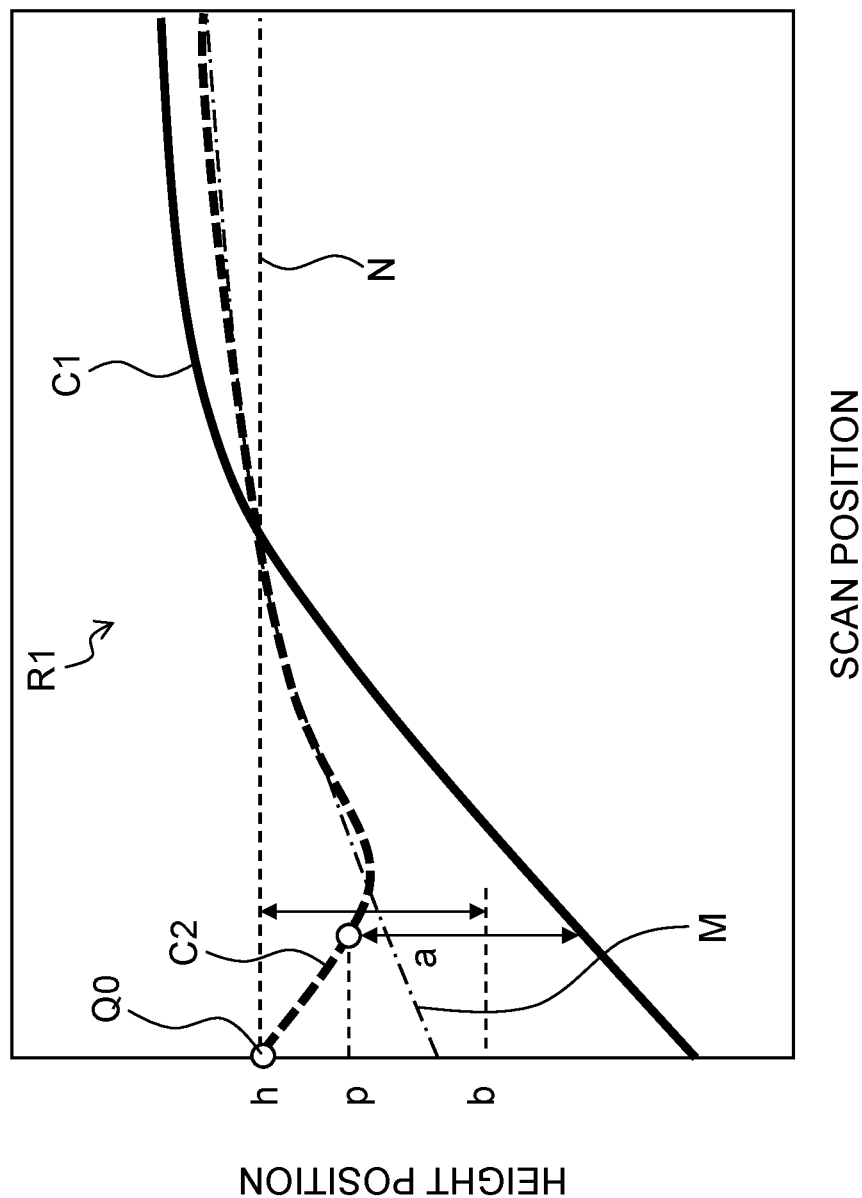
FIG. 5 is a diagram for illustrating a slow-tracking AF (autofocus) control.

FIG. 5 is a diagram for describing the slow-tracking AF control. FIG. 5 shows a surface displacement curve C1 indicating the displacement of the work surface in the work end portion R1, and a tracking curve C2 indicating a movement path of the light condensing point P2 of the detecting laser light L2 in a case where the AF control unit 58 performs the slow-tracking AF control to track the displacement of the work surface. In FIG. 5, the horizontal axis represents the scan position (the position in the direction along the planned dividing line), and the vertical axis represents the height position.

As shown in FIG. 5, in the slow-tracking AF control, one end (position indicated by Q0) of the work end portions R1 is set as a tracking start position, and the AF control unit 58 controls to move the condensing lens 24 in the optical axis direction with the actuator 25 such that the light condensing point P2 of the detecting laser light L2 tracks the displacement of the work surface from the tracking start position. In the slow-tracking AF control, the condensing lens 24 is held at a preset height (a reference height) so that the light condensing point P2 of the detecting laser light L2 has a predetermined entry height (control starting height) h at the tracking start position. Then, when the slow-tracking AF control is started, the AF detecting device 30 detects a detection signal indicating the height position of the front surface of the work W and outputs the detection signal to the AF control unit 58 in each control cycle.

The AF control unit 58 calculates the distance a between the light condensing point P2 of the detecting laser light L2 and the work surface based on the detection signal detected by the AF detecting device 30 (hereinafter, the distance a is referred to as "defocus distance a"). Then, the AF control unit 58 calculates a target position (height) b of the light condensing point P2 of the detecting laser light L2 in the next control cycle based on the calculated defocus distance a. The target position b of the light condensing point P2 of the detecting laser light L2 is calculated by the following equation (1).

$$b = h + a \quad (1)$$

Note that the defocus distance a indicates a negative value when the light condensing point P2 of the detecting laser light L2 is above the work surface, and indicates a positive value when the light condensing point P2 of the detecting laser light L2 is below the work surface.

Next, the AF control unit 58 calculates a target control amount d for moving the condensing lens 24 in the optical axis direction in the next control cycle based on the target position b of the light condensing point P2 of the detecting laser light L2. Note that, in this case, the AF control unit 58 functions as "target control amount calculator" of the present invention.

The next target control amount d is calculated by the following equation (2), where the current position (height) of the light condensing point P2 of the detecting laser light L2 is p.

$$d = (b - p) \times G \quad (2)$$

That is, the next target control amount d is a value obtained by multiplying the difference between the current position p of the light condensing point P2 of the detecting laser light L2 and the target position b by a control gain G.

Here, the following equation (3) is established when it is assumed that: the position (height) of the light condensing point P2 of the detecting laser light L2 in a certain control cycle is p0; the target control amount calculated at that time is d; the position (height) of the light condensing point P2 of the detection laser light L2 in the next control cycle is p1; and a tracking rate is F.

$$p1 = p0 + d \times F \quad (3)$$

Note that the tracking rate F is a value obtained by dividing a movement amount e by the target control amount d, when it is assumed that, in a case where the target control amount d is commanded in a certain control cycle, the movement amount e is a movement amount by which the light condensing point P2 of the detecting laser light L2 can be actually moved in the optical axis direction until the next control period. That is, the tracking rate F is a value defined by the following equation (4).

$$F = e/d \quad (4)$$

The tracking rate F is a value smaller than 1, for example, such as 0.01, due to a delay of the actuator 25 or the like.

Here, the tracking rate F is a value that is determined by characteristics of components that configure the optical system device 20, such as a thrust of the actuator 25 or a weight of the condensing lens 24. Further, the tracking rate F is not a constant because the tracking rate F increases in a case where the movement in the same direction is continued over a plurality of control cycles. Therefore, in the slow-tracking AF control, it is desirable to determine the control gain G in consideration of the value of the tracking rate F or its variation characteristic.

However, in a case where the control gain G is too large, the target control amount d of the condensing lens 24 oscillates due to acceleration of the condensing lens 24, and in a case where the control gain G is too small, the response of the condensing lens 24 is so slow that a desired operation cannot be achieved. Therefore, in the present embodiment, the control gain G is set to a value smaller than 1 (for example, 0.7) in order to prevent a control oscillation and improve the responsiveness and stability in the work end portion R1. Note that in the present embodiment, the control device 50 includes a control gain adjusting unit 62, and in a case where a user gives an instruction to change a setting of the control gain via the input device, the control gain adjusting unit 62 adjusts the control gain according to the instruction. The control gain adjusting unit 62 is an example of the "control gain adjuster" in the present invention.

Further, the AF control unit 58 calculates the next target control amount d as described above, and then controls the drive of the actuator 25 to move the condensing lens 24 in the optical axis direction by the amount according to the next target control amount d. As a result, the light condensing point P2 of the detecting laser light L2 in the next control cycle moves to the position obtained by the above-mentioned equation (3). Note that, in this case, the AF control unit 58 functions as "tracking controller" of the present invention.

According to the slow-tracking AF control that performs the above-described control, the target position (height) b of the light condensing point P2 of the detecting laser light L2 in the next control cycle is determined according to the defocus distance a calculated based on the detection signal detected by the AF detecting device 30 (see the equation (1)) with reference to the entry height h of the light condensing point P2 of the detecting laser light L2, instead of the current position (height) p of the light condensing point P2 of the detecting laser light L2. As a result, as shown in FIG. 5, the tracking curve C2 indicating the movement path of the light condensing point P2 of the detecting laser light L2 is controlled so as to approach an intermediate curve M (illustrated by a dash-dotted line) that passes through substantially the center between the straight line N indicating the entry height h of the light condensing point P2 of the detecting laser light L2 and the surface displacement curve C1. For example, when the light condensing point P2 of the detecting laser light L2 in a certain control cycle is on the intermediate curve M, the next target control amount d becomes zero.

[Laser Machining Method]

Figure 6:
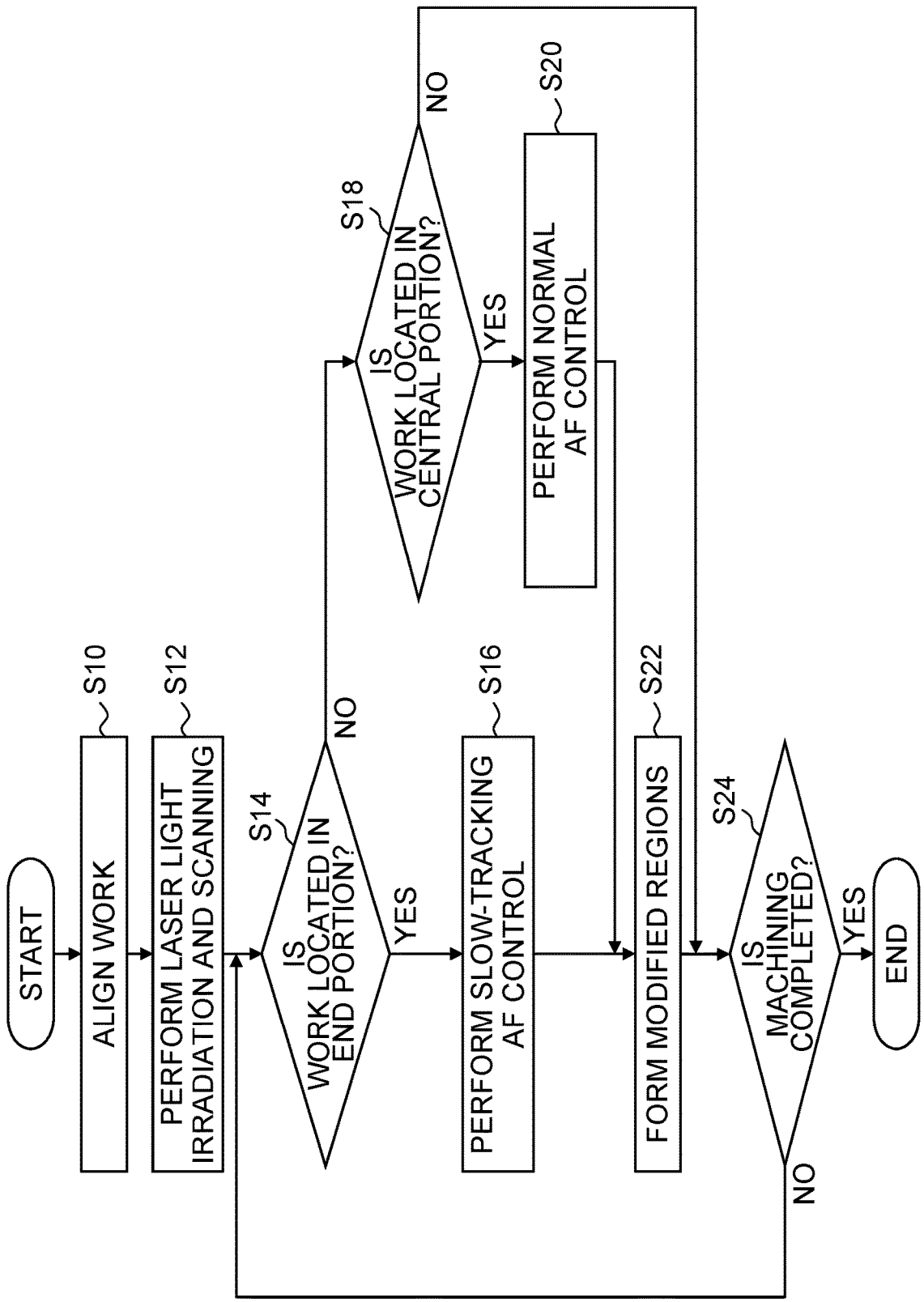
FIG. 6 is a flowchart showing a flow of a laser machining method using the laser machining device according to the present embodiment.

Next, a laser machining method using the laser machining device 10 according to the present embodiment is described below with reference to FIG. 6. FIG. 6 is a flowchart showing a flow of a laser machining method using the laser machining device 10 according to the present embodiment. Here, the below description is made on a case in which machining is performed on an arbitrary one of the planned dividing lines to be processed.

First, after the work W is placed on the stage 12, an alignment process is performed (step S10). In the alignment process, the work W is aligned using an alignment optical system (not shown).

Next, a laser light irradiation scanning process is performed (step S12). In the laser light irradiation scanning process, the machining laser light L1 is emitted from the laser light source 21, the detecting laser light L2 is emitted from the detecting laser light source of the AF detecting device 30, and the stage 12 is moved such that the machining laser light L1 and the detecting laser light L2 which are focused by the condensing lens 24 scan along the planned dividing line of the work W. At this time, as shown in FIG. 4, the machining laser light L1 and the detecting laser light L2 are made to scan from a position outside the work W toward the inside of the work W.

Next, a first determination process is performed (step S14). In the first determination process, the determination unit 60 determines whether the current scan position is located in the work end portion R1.

When the current scan position is determined to be located in the work end portion R1 (Yes in step S14) as a result of the first determination process, the AF control unit 58 performs a feedback control of the position of the condensing lens 24 by the slow-tracking AF control (step S16; corresponding to the "second control step" of the present invention) while the work W is irradiated with the machining laser light L1 via the condensing lens 24 to form modified regions inside the work W (step S22).

On the other hand, when the current scan position is determined not to be located in the work end portion R1 (No in step S14) as a result of the first determination process, a second determination process is performed (step S18). In the second determination process, the determination unit 60 determines whether the current scan position is located in the work central portion R2.

When the current scan position is determined to be located in the work central portion R2 (Yes in step S18) as a result of the second determination process, the AF control unit 58 performs a feedback control of the position of the condensing lens 24 by the normal AF control (step S20; corresponding to the "first control step" of the present invention) while the work W is irradiated with the machining laser light L1 via the condensing lens 24 to form modified regions inside the work W (step S22)

On the other hand, when the current scan position is determined not to be located in the work central portion R2 (No in step S18) as a result of the second determination process, the case represents that the current scan position is not located on the work W. In this case, the process proceeds to step S24.

After the modified region forming process of step S22 is performed, or when the determination result is "No" in the second determination process of step S18, a judgement process of judging whether the machining of the work W is completed is performed (step S24). In the judgement process, the main control unit 52 judges whether the formation of the modified region has been completed for the planned dividing line to be machined.

When it is judged that the machining of the work W is not completed (No in step S24) as a result of the judgement process, the process returns to step S14 and the same processes are repeated. On the other hand, when it is judged that the machining of the work W is completed (Yes in step S24) as a result of the judgement process, the flowchart ends.

Although the description here has been made on the case in which the machining is performed on an arbitrary one of the planned dividing lines to be machined, the same process is performed on all the planned dividing lines of the work W.

[Advantageous Effects According to the Present Embodiment]

According to the present embodiment, the normal AF control is performed in the work central portion R2, and the slow-tracking AF control is performed in the work end portion R1. The slow-tracking AF control has a lower trackability to the displacement of the work surface than the normal AF control, and can stably perform the tracking to the displacement of the work surface while preventing the control oscillation in the work end portion R1. As a result, stable control can be achieved so as to prevent significant fluctuations of the light condensing point P1 of the machining laser light L1 even in the work end portion R1. That is, the autofocus function can be stably operated without causing an undesirable state such as an overshoot etc. As a result, the light condensing point P1 of the machining laser light L1 can be located at positions of a certain depth from the work surface so that the modified region 14 can be accurately and stably formed at a desired position inside the work W.

Note that the slow-tracking AF control may be one other than the present embodiment so long as the slow-tracking AF has a function of reducing the trackability to the displacement of the work surface as compared with the normal AF control.

For example, as another example of the slow-tracking AF control, a value obtained by multiplying the value of the defocus distance a which is calculated based on the detection signal detected by the AF detecting device 30, by a predetermined variable m may be used as a control command value (namely a control command value for the actuator 25) for moving the condensing lens 24 up and down in the optical axis direction (Z direction). Here, the defocus distance a is the distance a between the light condensing point P2 of the detecting laser light L2 and the work surface, and the variable m is a variable which has a value of 0 or more and 1 or less and approaches 1 as the condensing lens 24 moves from a position outside of the work W toward the inside of the work W.

Here, there is the following difference between the case where the other example of the slow-tracking AF control is performed and the case where it is not performed in the work end portion R1.

As an example of the case where the other example of the slow-tracking AF control is not performed, FIG. 7 is a diagram showing changes in the height position (the position of the light condensing point P2) of the condensing lens 24 in the case where the condensing lens 24 is held (fixed) at an initial position which is a specific position in the work end portion R1 without operating the autofocus function. FIG. 8 is a diagram showing changes in the height position (position of the light condensing point P2) of the condensing lens 24 when the other example of the slow-tracking AF control is performed in the work end portion R1. Note that FIGS. 7 and 8 show the height position of the front surface of the work W together with the height position of the condensing lens 24. In addition, in this case, as an example, the work W is a silicon wafer and the front surface of the work W is a surface opposite to the device surface of the silicon wafer. That is, FIGS. 7 and 8 each show a case in which the height position of the front surface of the work W (that is, the surface opposite to the device surface of the silicon wafer) gradually becomes lower as the position moves from a position outside of the work W (outer edge) to the inside (central side) of the work W. That is, FIGS. 7 and 8 indicate that the outer edge (wafer edge) portion of the silicon wafer warps upward. The change in the height position of the front surface of the work W shown in FIGS. 7 and 8 is a phenomenon often seen in silicon wafers.

As shown in FIG. 7, when the condensing lens 24 is held at the initial position which is a specific position in the work end portion R1 without operating the autofocus function, the position of the condensing lens 24 is held at a constant height in a case where the condensing lens 24 is in a section (height-locking section) within a predetermined distance from the outer edge of the work W toward the inside of the work W. Here, in a case where the condensing lens 24 is held at a constant height in the height-locking section and then the condensing lens 24 is released from the holding, the defocus distance a which is the distance between the position of the light condensing point P2 of the condensing lens 24 and the front surface of the work W becomes large. This increases the control command value for moving the condensing lens 24 up and down in the optical axis direction in order that the defocus distance a becomes 0 (zero). When the drive of the actuator 25 is controlled based on the control command value, the height position of the condensing lens 24 changes sharply and largely. As a result, the difference between the position of the light condensing point P2 of the condensing lens 24 and the height position of the front surface of the work W (that is, the defocus distance a) becomes large, and a further control performed thereafter tends to cause an unfavorable state such as an overshoot etc.

On the other hand, as shown in FIG. 8, in the other example of the slow-tracking AF control, a value obtained by multiplying the defocus distance a described above (that is, the distance a between the light condensing point P2 of the detecting laser light L2 and the work surface) by the predetermined variable m is set as the control command value for moving the condensing lens 24 up and down in the optical axis direction (Z direction). Accordingly, the control command value does not become a large value in the first place. Therefore, when the drive of the actuator 25 is controlled based on this control command value, the height position of the condensing lens 24 does not change sharply and largely. As a result, the difference between the position of the light condensing point P2 of the condensing lens 24 and the height position of the front surface of the work W does not become large, and an unfavorable state such as an overshoot etc. does not occur even if further control is performed thereafter, so that the autofocus function can be stably operated.

Therefore, the other example of the slow-tracking AF control also can stably track the displacement of the work surface while preventing the control oscillation in the work end portion R1, and thus it is possible to achieve the same effect as the slow-tracking AF control in the above-described present embodiment.

Note that, in the other example of the slow-tracking AF control, in the above case, as one of preferable aspects, the variable m to be multiplied by the defocus distance a is set to a value of 0 or more and 1 or less, and approaches 1 as the condensing lens 24 moves from a position outside the work W to the inside of the work W. However, the variable is not limited to this. For example, the variable m may be a value of 0 or more and 1 or less, and may be a fixed value regardless of the position of the condensing lens 24 relative to the work W in plan view. Further, in a case where the variable m is a value of 0 or more and 1 or less, and approaches 1 as the condensing lens 24 moves from a position outside the work W toward the inside of the work W, the variable m may linearly increase according to the distance from the outer edge of the work W, or the variable m may increase stepwise (discretely) according to the distance from the outer edge of the work W.

In the laser machining device 10 according to the present embodiment, the machining laser light L1 is linearly moved relatively to the work W to linearly machine the work from a position where the work is not located (a position outside the outer edge of the work W) through the work position (a position where the work W is located). The laser machining device 10 is intended to divide (cut) the work W by linearly and relatively moving the machining laser light L1, and needs to machine the work W from a position where the work is not located through the work edge portion (the outer edge portion of the work W) and the work flat portion (the portion where the thickness of the work W is uniform), without causing an overshoot. Therefore, in order for the laser machining device 10 to accurately form the modified regions 14 at predetermined depth positions inside the work W from the front surface of the work W (laser light irradiation surface), the surface shape of the work W should be accurately traced. Because the above-described slow-tracking AF control (including the other example described above) performed by the laser machining device 10 according to the present embodiment enables to stably track the displacement of the work surface while preventing the control oscillation in the work end portion R1, the above object can be achieved.

Further, in the present embodiment, the reflected light of the detecting laser light L2 reflected on the front surface of the work W (laser light irradiation surface) is used to control the position of the condensing lens 24 so as to track the displacement of the front surface of the work W, but the present invention is not limited to this. For example, the reflected light of the detecting laser light L2 reflected on the back surface of the work W (opposite surface to laser light irradiation surface) may be used to control the position of the condensing lens 24 so as to track the displacement of the back surface of the work W. In this case, the back surface of the work W corresponds to the "main surface of the work" of the present invention.

Further, in the present embodiment, the range of the work end portion R1 to which the slow-tracking AF control is applied may be fixed or changeable. For example, the laser machining device may be configured such that a user can select a desired range from a plurality of preset ranges via an input device such as keyboard or mouse (not shown). Further, the laser machining device may also be configured such that a user can freely change the work end portion R1 to an arbitrary range depending on a type of the work W to be machined.

In addition, in the present embodiment, the stage 12 is configured to be movable in the XYZθ directions, but any other configuration may be used so long as the optical system device 20 and the stage 12 can be relatively moved in the XYZθ directions. For example, the stage 12 may be configured to be movable in the XZθ directions and the optical system device 20 may be configured to be movable in the Y direction.

Further, the present embodiment shows the laser machining device (laser machining device 10) configured to condense the machining laser light L1 inside the work W via the condensing lens 24 to perform machining, as an example of the laser machining device of the present invention. However, the present invention is not limited to this, and the present invention can also be applied to a laser machining device configured to condense the machining laser light L1 on the front surface of the work W via the condensing lens 24 to perform machining.

Although one example of the present invention has been described in detail, the present invention is not limited to this, and naturally various improvements or modifications may be made without departing from the gist of the present invention.

REFERENCE SIGNS LIST

10 ... laser machining device, 12 ... stage, 20 ... optical system device, 21 ... laser light source, 23 ... dichroic mirror, 24 ... condensing lens, 25 ... actuator, 30 ... AF (autofocus) detecting device, 50 ... control device, 52 ... main control unit, 54 ... stage control unit, 56 ... laser control unit, 58 ... AF control unit, 60 ... determination unit, 62 ... control gain adjusting unit, L1 ... machining laser light, L2 ... detecting laser light

What is claimed is:

1. A laser machining device which condenses a machining laser light inside a work to form a modified region inside the work along a planned dividing line, the laser machining device comprising:
   a condensing lens configured to condense the machining laser light and a detecting laser light toward the work;
   a scanner configured to relatively move the condensing lens and the work in a direction orthogonal to an optical axis direction of the condensing lens, to scan the machining laser light and the detecting laser light over the work;
   an adjuster configured to adjust a distance between the condensing lens and the work;
   a detector configured to detect a reflected light to output a detection signal according to a height of a main surface of the work, the reflected light being the detecting laser light reflected on the main surface of the work;
   a first controller configured to control, based on the detection signal output by the detector; the adjuster so as to cause a light condensing point of the detecting laser light to track a displacement of the main surface of the work, in case where a scan position of the machining laser light and the detecting laser light is in a central portion of the work; and
   a second controller configured to control; based on the detection signal output by the detector, the adjuster so as to cause the light condensing point of the detecting laser light to track the displacement of the main surface of the work with a trackability to the displacement of the main surface of the work reduced to be lower than a trackability of the first controller, in a case where the scan position of the machining laser light and the detecting laser light is in an end portion of the work.

2. The laser machining device according to claim 1, wherein the second controller comprises:
   a target control amount calculator configured to calculate a target control amount of the condensing lens based on the detection signal output from the detector; and
   a tracking controller configured to control the adjuster so as to cause the light condensing point of the detecting laser light to track the displacement of the main surface of the work based on the target control amount calculated by the target control amount calculator.

3. The laser machining device according to claim 2, wherein
   in a case where a position of the light condensing point of the detecting laser light is defined as a first position and a position on the main surface of the work is defined as a second position, at a time that the second controller starts tracking,
   the target control amount calculator sets a position between the first position and the second position as a target position, and calculates the target control amount based on a current position of the light condensing point of the detecting laser light and the target position.

4. The laser machining device according to claim 3, wherein
   the second controller calculates, as the target control amount, a value obtained by multiplying a difference between the current position of the light condensing point of the detecting laser light and the target position, by a control gain.

5. The laser machining device according to claim 4, comprising
   a control gain adjuster configured to adjust the control gain according to a user's instruction.

6. The laser machining device according to claim 1, comprising
   a determiner configured to determine whether the scan position of the machining laser light and the detecting laser light is in the end portion of the work or in the central portion of the work.

7. The laser machining device according to claim 1, wherein
   the wafer has a first surface on which devices are formed and a second surface opposite to the first surface, and
   the main surface of the work is the second surface.

8. The laser machining device according to claim 1, wherein
   the main surface of the work is a surface of the work facing the condensing lens.

9. The laser machining device according to claim 1, wherein
   the main surface of the work is a surface of the work opposite to a surface facing the condensing lens.

10. The laser machining device according to claim 1, comprising
    a range changer configured to be able to change a range of the end portion of the work.

11. A laser machining method of condensing a machining laser light inside a work to form a modified region inside the work along a planned dividing line, using a laser machining device including:
    a condensing lens configured to condense the machining laser light and a detecting laser light toward the work;
    a scanner configured to relatively move the condensing lens and the work in a direction orthogonal to an optical axis direction of the condensing lens to scan the machining laser light and the detecting laser light over the work;
    an adjuster configured to adjust a distance between the condensing lens and the work; and
    a detector configured to detect a reflected light to output a detection signal according to a height of a main surface of the work, the reflected light being the detecting laser light reflected on the main surface of the work,
    the laser machining method comprising:
    a first control step of controlling, based on the detection signal output from the detector, the adjuster so as to cause a light condensing point of the detecting laser light to track a displacement of the main surface of the work, in a case where a scan position of the machining laser light and the detecting laser light is in a central portion of the work; and
    a second control step of controlling, based on the detection signal output from the detector, the adjuster so as to cause the light condensing point of the detecting laser light to track the displacement of the main surface of the work, with a trackability to the displacement of the main surface of the work reduced to be lower than a trackability in the first control step, in a case where the scan position of the machining laser light and the detecting laser light is in an end portion of the work.

12. The laser machining method according to claim 11, comprising:
    a target control amount calculation step of calculating a target control amount of the condensing lens based on the detection signal output from the detector; and
    a tracking control step of controlling the adjuster so as to cause the light condensing point of the detecting laser light to track the displacement of the main surface of the work based on the target control amount calculated in the target control amount calculation step.

13. The laser machining method according to claim 12, wherein in a case where a position of the light condensing point of the detecting laser light is defined as a first position and a position on the main surface of the work is defined as a second position, at a time that tracking by the second control step starts, the target control amount calculation step sets a position between the first position and the second position as a target position, and calculates the target control amount based on a current position of the light condensing point of the detecting laser light and the target position.

14. The laser machining method according to claim 13, wherein the second control step calculates, as the target control amount, a value obtained by multiplying a difference between the current position of the light condensing point of the detecting laser light and the target position, by a control gain.

15. The laser machining method according to claim 14, comprising a control gain adjustment step of adjusting the control gain according to a user's instruction.

16. The laser machining method according to claim 11, comprising a determination step of determining whether the scan position of the machining laser light and the detecting laser light is in the end portion of the work or in the central portion of the work.

17. The laser machining method according to claim 11, wherein the wafer has a first surface on which devices are formed and a second surface opposite to the first surface, and the main surface of the work is the second surface.

18. The laser machining method according to claim 11, the main surface of the work is a surface of the work facing the condensing lens.

19. The laser machining method according to claim 11, wherein the main surface of the work is a surface of the work opposite to a surface facing the condensing lens.

20. The laser machining method according to claim 11, comprising a range change step in which a range of the end portion of the work is changeable.

* * * * *